(12) United States Patent
Niwatsukino

(10) Patent No.: US 7,602,088 B2
(45) Date of Patent: Oct. 13, 2009

(54) LINEAR MOTOR AND EXPOSURE APPARATUS HAVING THE SAME

(75) Inventor: Aya Niwatsukino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/836,939

(22) Filed: Aug. 10, 2007

(65) Prior Publication Data

US 2007/0279614 A1    Dec. 6, 2007

Related U.S. Application Data

(62) Division of application No. 11/212,652, filed on Aug. 29, 2005, now Pat. No. 7,271,510.

(30) Foreign Application Priority Data

Aug. 30, 2004    (JP)    ............................. 2004-250390

(51) Int. Cl.
*H02K 41/00*    (2006.01)
(52) U.S. Cl. ...................................................... 310/12
(58) Field of Classification Search ................... 310/12
See application file for complete search history.

(56) References Cited

U.S. PATENT DOCUMENTS

| | | | |
|---|---|---|---|
| 4,247,794 A | 1/1981 | Jooss et al. | 310/13 |
| 4,318,038 A | 3/1982 | Munehiro | 318/135 |
| 4,916,340 A | 4/1990 | Negishi | 310/12 |
| 5,130,583 A | 7/1992 | Andoh | 310/12 |
| 5,973,459 A | 10/1999 | Itoh | 318/135 |
| 6,107,703 A | 8/2000 | Korenaga | 310/12 |
| 6,144,118 A | 11/2000 | Cahill et al. | 310/12 |
| 6,265,793 B1 | 7/2001 | Korenaga | 310/12 |
| 6,326,708 B1 | 12/2001 | Tsuboi et al. | 310/12 |
| 6,348,746 B1 | 2/2002 | Fujisawa et al. | 310/12 |
| 6,573,623 B2 | 6/2003 | Tsuboi et al. | 310/12 |
| 6,713,903 B2 * | 3/2004 | Widdowson et al. | 310/12 |
| 6,717,653 B2 | 4/2004 | Iwamoto et al. | 355/72 |
| 6,873,404 B2 | 3/2005 | Korenaga | 355/72 |
| 6,965,426 B2 * | 11/2005 | Takashima | 355/53 |
| 7,276,866 B2 * | 10/2007 | Asano | 318/135 |
| 2006/0043799 A1 | 3/2006 | Niwatsukino | 310/12 |

FOREIGN PATENT DOCUMENTS

| | | |
|---|---|---|
| JP | 9-19178 | 1/1997 |
| JP | 2002-8971 | 1/2002 |
| JP | 2002-258289 | 9/2002 |

* cited by examiner

*Primary Examiner*—Quyen P Leung
*Assistant Examiner*—Iraj A Mohandesi
(74) *Attorney, Agent, or Firm*—Fitzpatrick, Cella, Harper & Scinto

(57) ABSTRACT

A method of driving a linear motor having a multi-phase coil as a stator or a movable element includes the steps of positioning the stator at a position where a driving electric power becomes largest, and driving the movable element relative to the stator.

6 Claims, 9 Drawing Sheets

LINEAR MOTOR AND EXPOSURE APPARATUS HAVING THE SAME

This is a divisional of application Ser. No. 11/212,652, filed on Aug. 29, 2005.

FIELD OF THE INVENTION AND RELATED ART

This invention relates to a linear motor having a multi-phase coil and, more particularly, to a linear motor suitably usable in an exposure apparatus.

Driving systems for moving a mask stage or a wafer stage in semiconductor exposure apparatuses include one using a multi-phase linear motor in which coils are selectively switched over in accordance with the position of a movable element of the motor. Japanese Laid-Open Patent Application, Publication No. 09-19178 and Japanese Laid-Open Patent Application, Publication No. 2002-258289 show a multi-phase exciting sinewave driving method as a method of controlling the drive current of such multi-phase linear motor. In these Japanese patent documents, for driving the stage, to two-phase coils which are placed at positions spaced from each other by 90-degree equivalent in terms of the phase angle of the magnetic flux density, electric currents corresponding to the respective magnetic flux densities are applied simultaneously (two-phase excitement), by which a certain thrust force is produced in accordance with the principle that $$\sin^2(x)+(-\cos(x))^2=1.$$

FIG. 7 illustrates an example of a multi-phase linear motor having plural coils. Denoted in the drawing at 15 are movable magnets, and denoted at 14 are stator coils. Serial numbers 1-4 are assigned to these stator coils for convenience in explanation. With this structure, coils 14 to be energized as well as the orientation of the electric current are switched over in accordance with the position of the movable element 15, by which the movable element 15 is moved.

FIG. 8 shows an example of magnetic flux density distributions, representing the magnetic flux densities of magnetic fluxes passing through the coils, with respect to the position of the movable element of the multi-phase linear motor. The coil phase A and coil phase B can be regarded as a coil No. 1 and a coil No. 2, respectively. Here, if the magnetic flux density of the phase A can be expressed by $\cos(x)$ where the position of the movable element is given by x, an electric current which is proportional to $\cos(x)$ is applied to the phase A. On the other hand, in regard to the phase B having a phase angle of magnetic flux density being shifted by 90 degrees from the phase A (thus the magnetic flux density of the phase B can be expressed by $\sin(x)$), an electric current being proportional to $\sin(x)$ is applied thereto.

In accordance with the method described above, there is a possibility that, depending on the position of the movable element, most acceleration is carried out by use of a single phase coil only. For example, in FIG. 8, at a place where the magnetic flux density of the phase B coil becomes equal to zero, that is, at a place where the electric phase angle becomes equal to zero degree, such as at position pos_a, the magnetic flux density of the phase A coil becomes largest and thus the electric current corresponding to the magnetic flux density becomes largest, too. Similarly, at positions pos_b, pos_c and pos_d in FIG. 8, the magnetic flux density of one of the two phases becomes largest. At these positions, electric consumption and heat generation occur in the coil whose electric phase angle is not equal to zero degree, whereas electric consumption and heat generation do not occur in the coil whose electric phase angle is equal to zero degree. This phenomenon is particularly notable where the driving electric power for acceleration/deceleration of the movable element, for example, is large and it may cause unbalanced heat generation.

If it occurs, the temperature of one coil is raised relatively and it may rise beyond the allowable temperature of an insulative coating film of wires. Furthermore, motor drivers for producing a driving force of each coil need to have a capacity that enables flow of a larger electric current. Moreover, the higher the temperature is, the larger the resistance of each coil is. Hence, the electric power efficiency will be lowered.

SUMMARY OF THE INVENTION

It is accordingly an object of the present invention to provide a unique and improved linear motor by which at least one of the inconveniences described above can be removed or reduced.

It is another object of the present invention to provide an exposure apparatus having such a linear motor.

In accordance with an aspect of the present invention, there is provided a linear motor having a multi-phase coil to be energized, comprising: a movable element; a stator; and a control system for controlling the position of said movable element; wherein said control system is arranged to acquire drive information related to said linear motor going to be driven, and to position said stator on the basis of the drive information prior to the driving.

In one preferred form of this aspect of the present invention, for acceleration/deceleration of said movable element, said control system may position said stator so that an electric phase angle of said linear motor is brought into a predetermined state.

Further, for acceleration/deceleration of said movable element, said control system may operate to position said stator so as to reduce local heat generation of said linear motor.

The control system may position said stator so as to make uniform or approximately uniform electric currents to be applied to coils which are used for the driving for a maximum driving electric power of said linear motor.

The control system may operate to position said stator so as to avoid that, when a driving electric power of said linear motor becomes largest, an electric phase angle of each coil phase becomes equal to zero or close to zero.

Furthermore, where the linear motor has a two-phase coil to be energized, said control system may operate to position said stator so that, when a driving electric power of said linear motor becomes largest, an electric phase angle of each phase coil becomes equal to or close to 45 degrees.

In accordance with the present invention, a consumed electric current particularly at large current consumption is distributed to plural coils, by which the largest consumed electric current at each coil is reduced. Therefore, temperature rise of a single coil can be suppressed and the load for a motor driver can be made light. As a result, efficient electric current consumption is enabled.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

First Embodiment

Figure 3:
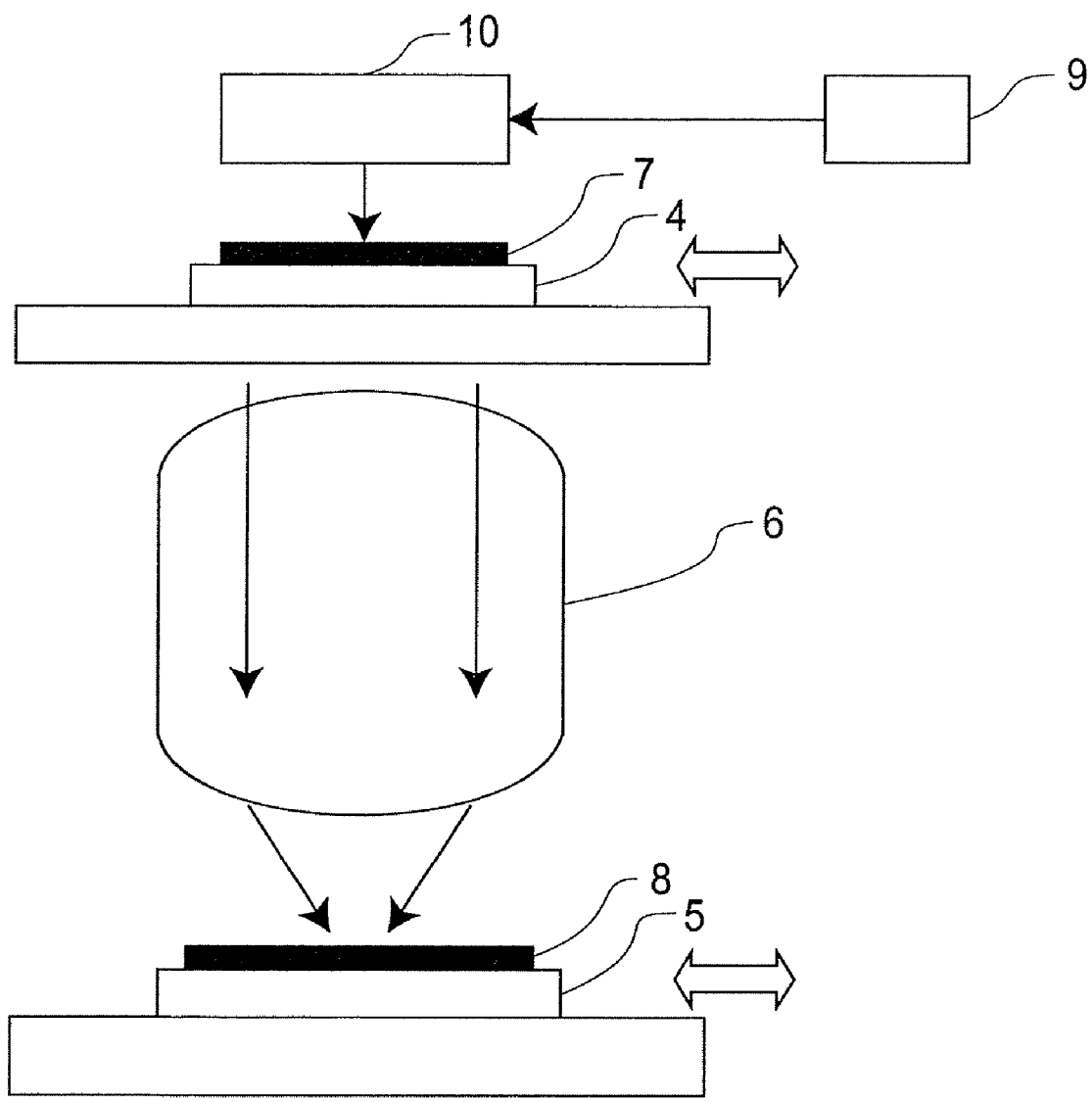
FIG. 3 is a schematic view of a general structure of a scanning exposure type projection exposure apparatus according to an embodiment of the present invention.

FIG. 3 is a schematic view of a general structure of a step-and-scan type projection exposure apparatus according to a first embodiment of the present invention. In the drawing, light from a light source 9 is shaped by an illumination optical system 10 into a slit-like shape, and then it is projected on an original 7 that is held on a reticle stage 4. After that, light passed through a projection optical system 6 is projected on a photosensitive substrate 8, held on a wafer stage 5, whereby the substrate is exposed. Here, the reticle stage 4 and the wafer stage 5 are moved in mutually opposite directions, by which an exposure field larger than the slit width is provided. The reticle stage is driven in accordance with a multi-phase exciting driving method such as described hereinbefore.

Figure 4:
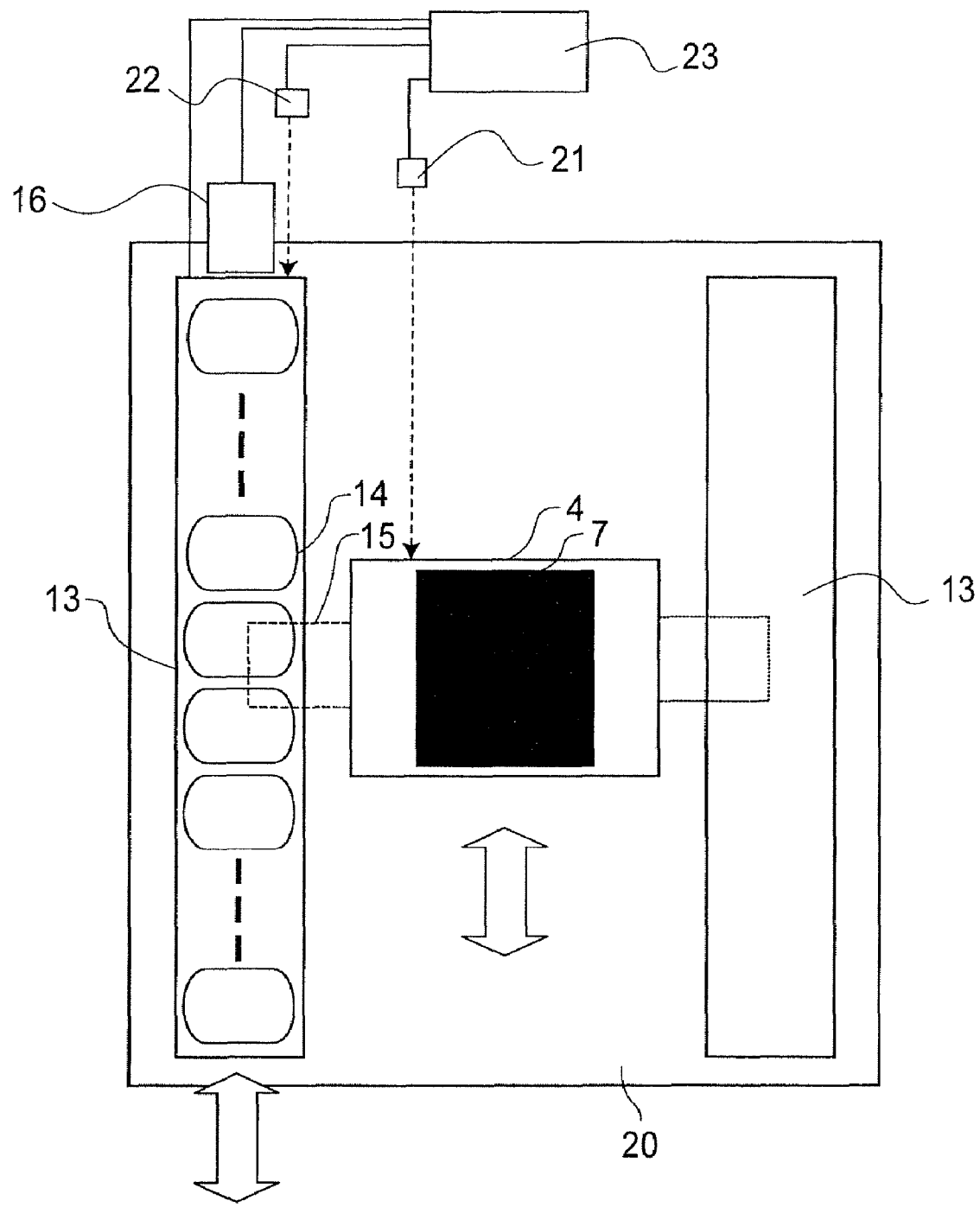
FIG. 4 is a schematic view, showing an example of the structure of a reticle stage used in FIG. 5.

FIG. 4 is a plan view of a reticle stage. The right-hand half of the drawing does not illustrate details because the structure thereof is similar to that of the left-hand half. In FIG. 4, the reticle stage 4 is floated above a reticle stage base table 20 with a small clearance, by means of a gas bearing (not shown). The reticle stage 4 can be moved in directions of an arrow, by means of a linear motor that has a stator 13 and a movable element 15. The stator 13 includes a plurality of stator coils 14, and the movable element 15 has magnets. The stator 13 as well can be moved in directions of an arrow along the reticle stage base table 20, by means of a gas bearing (not shown). By making the stator movable as such as described above, undesirable influences of vibration or the like due to a drive reaction force during the stage driving can be reduced. The stator 13 can be driven so as to cancel the drive reaction force described above, by mean of a linear motor 16, and the structure disclosed in Japanese Laid-Open Patent Application, Publication No. 2002-8971 may be used therefor. Detailed explanation will therefore be omitted here.

A reticle 7 is held by the reticle stage 4. As the reticle stage 4 is driven in a direction of an arrow in accordance with the view angle of the reticle 7, whereby scan exposure thereof is carried out. The reticle stage 4 is connected to the movable element 15, and thus it is movable with the movement of the movable element 15. The position of the reticle stage (movable element) is measured by means of a laser interferometer 21, and also the position of the stator 13 is measured by means of another laser interferometer 22.

In the step-and-scan exposure, the driving pattern of the reticle stage is determined by the length of the reticle in the scan direction, the scan speed and the acceleration, for example. Conventionally, these parameters are constant with respect to a single substrate to be exposed. Thus, when a reticle pattern is going to be printed on a substrate, the reticle stage performs repeated drives of a number corresponding to the exposure shots, constantly in accordance with a particular driving pattern.

Figure 5:
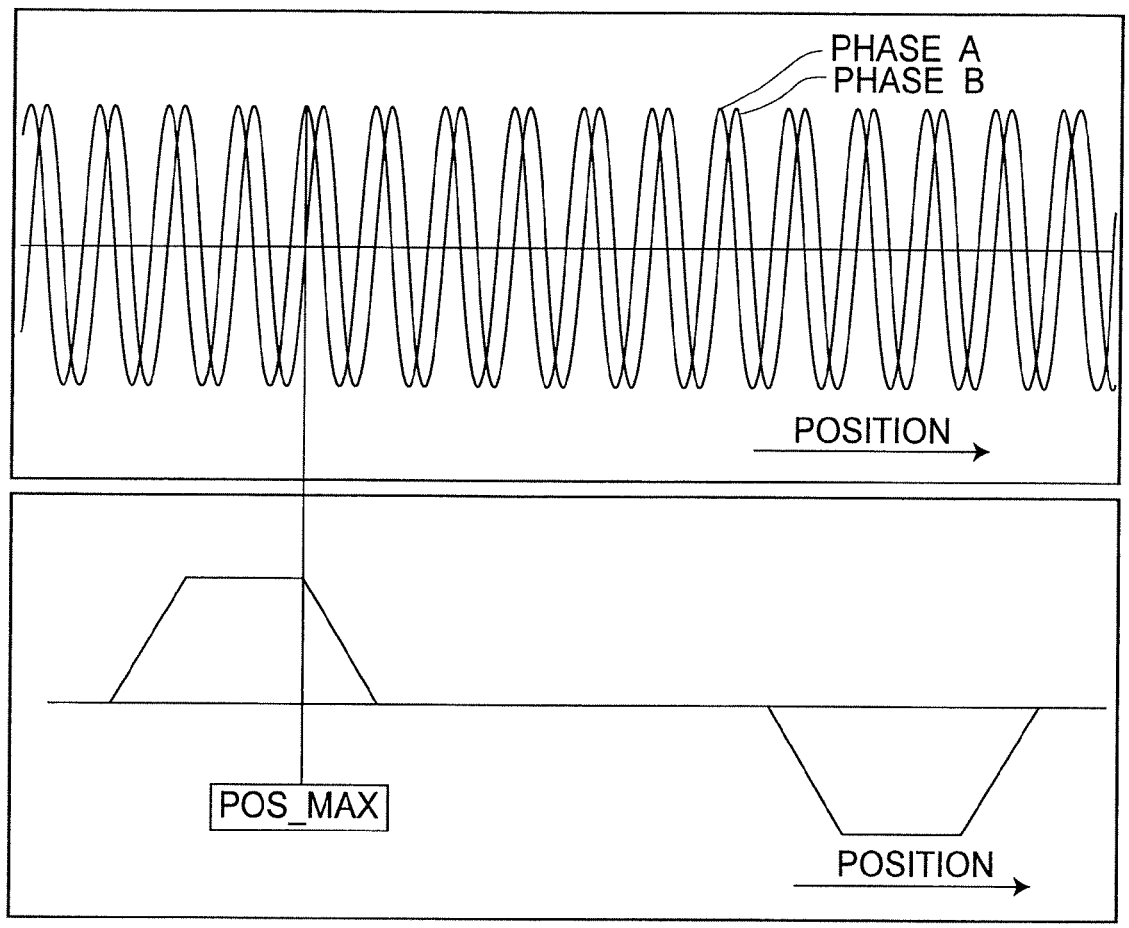
FIG. 5 is a chart for explaining an example of magnetic flux density distributions of a linear motor coil based on a multi-phase exciting driving method wherein a load is applied to only one phase.

FIG. 5 shows an example of magnetic flux density of a two-phase coil in regard to the position of a movable element, as well as an example of a reticle stage driving pattern. The upper half of the drawing illustrates the magnetic flux density of the two-phase coil, and the lower half o the drawing illustrates the acceleration of the reticle stage. In a case where the driving electric power becomes largest at a position pot_max, since in this driving pattern at the position pos_max the driving electric power is produced only in the phase A, loads are applied only to the phase A. For exposure of a reticle pattern, since the reticle stage performs drives of a number corresponding to the exposure shots, in accordance with the same driving pattern, it means that, in the case of the driving pattern of this example, a large load is applied only to the phase A coil at the position pot_max.

Figure 6:
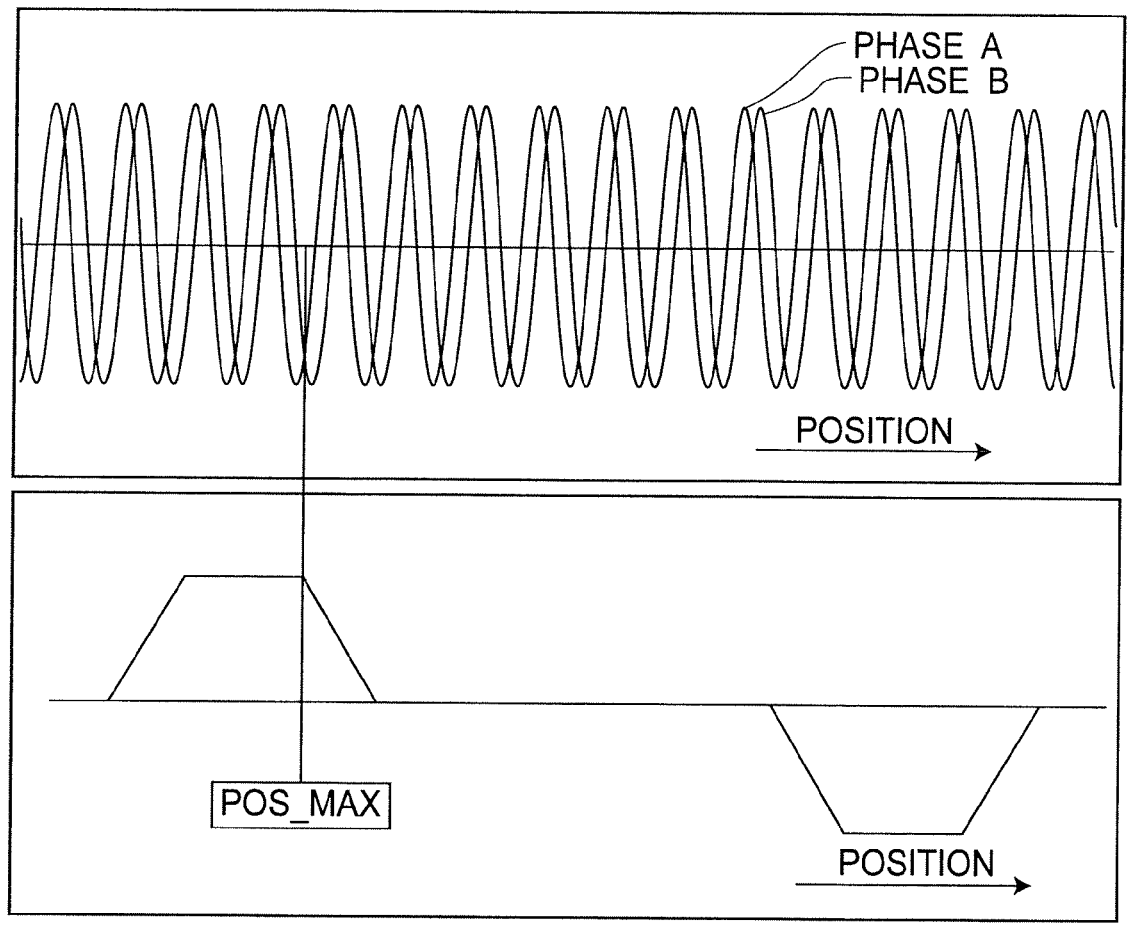
FIG. 6 is a chart for explaining an example of magnetic flux density distributions of a linear motor coil wherein equivalent loads are applied to both of two-phase coils in accordance with an embodiment of the present invention.
Figure 7:
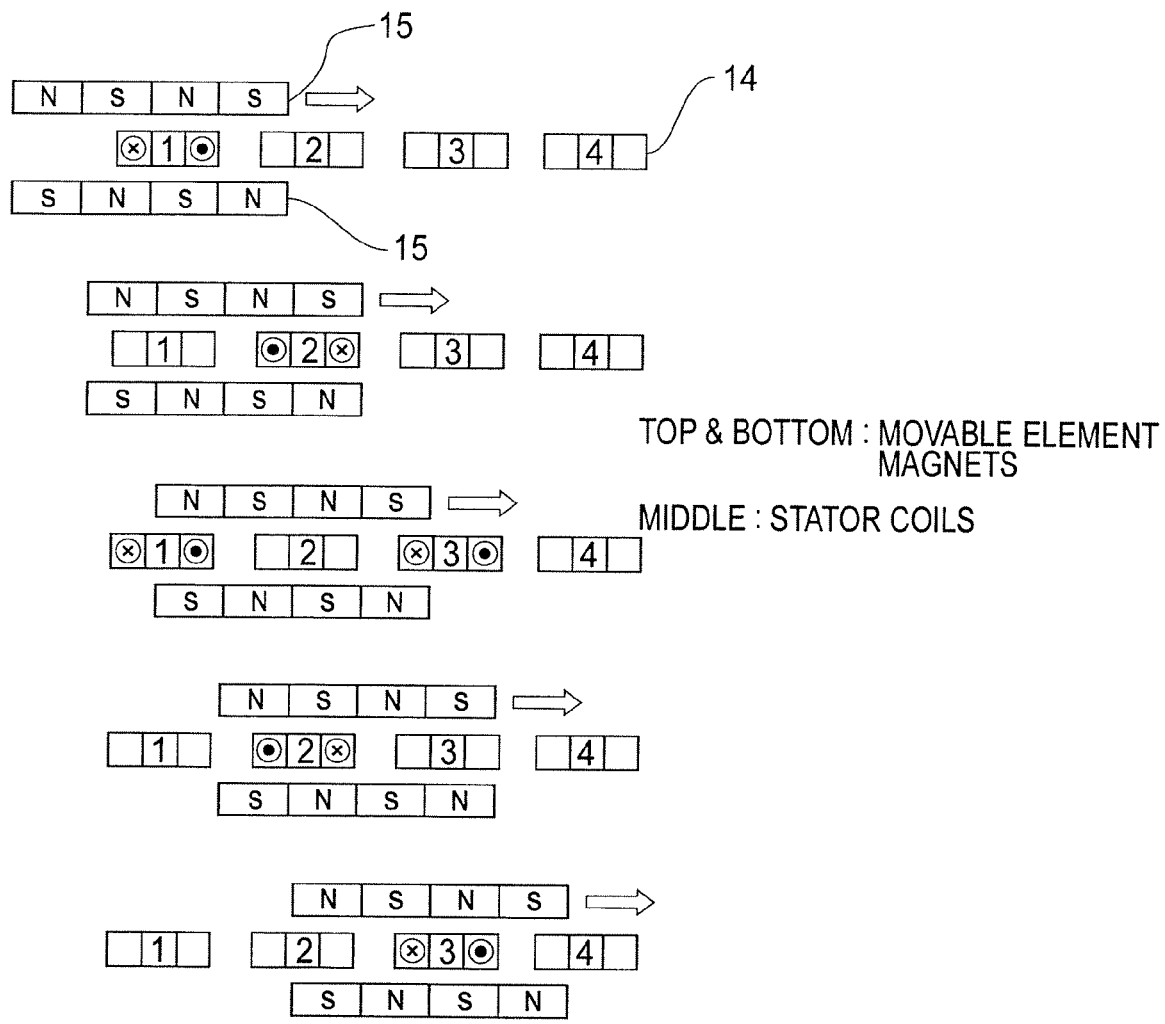
FIG. 7 is a schematic view for explaining a driving method for a linear motor based on a multi-phase exciting driving method.
Figure 8:
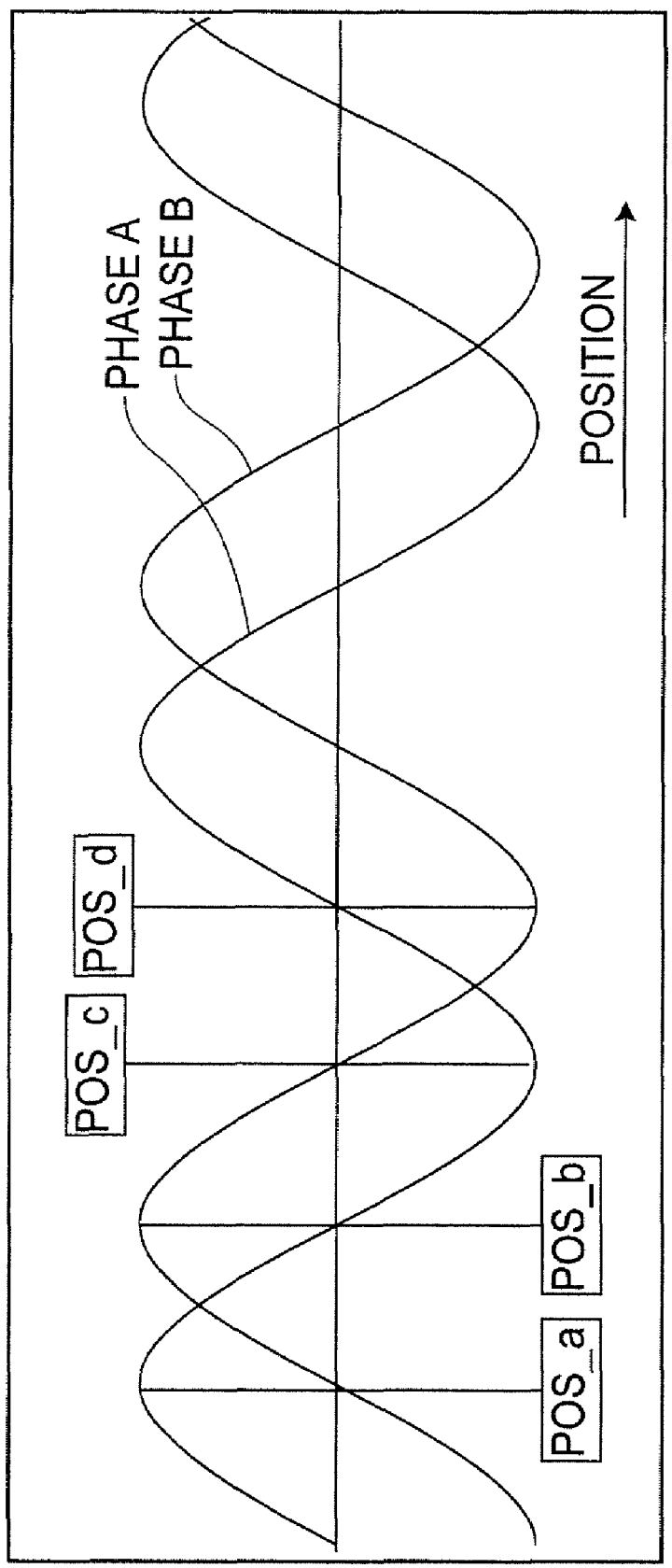
FIG. 8 is a chart for explaining an example of coil magnetic flux density distributions of a linear motor based on a multi-phase exciting driving method.

This problem can however be avoided by displacing the stator coil before start of the exposure so that, as shown in FIG. 6, the position pot_max comes to a place different from what is described above.

Figure 1:
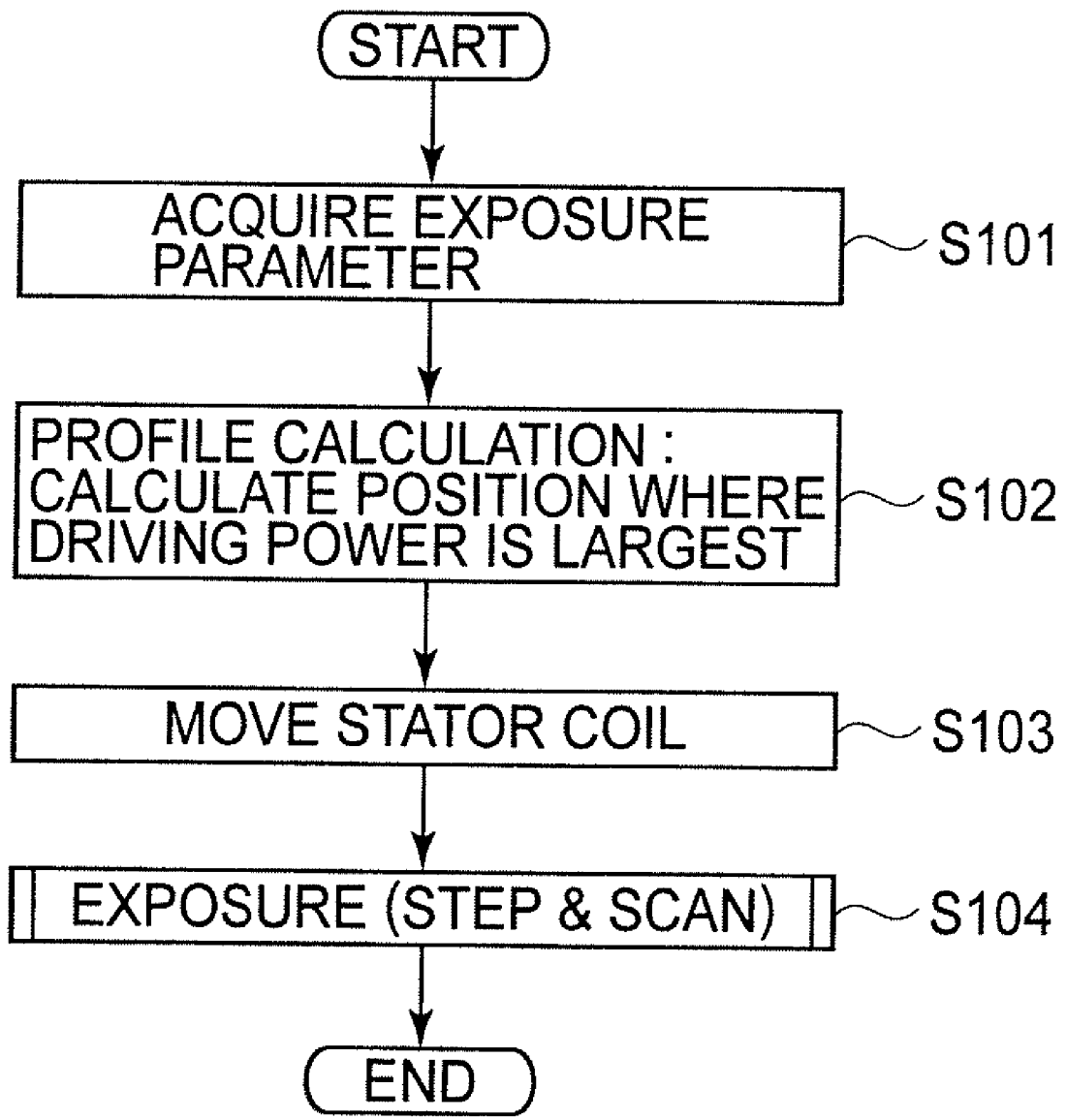
FIG. 1 is a flow chart for explaining the procedure of stage driving according to an embodiment of the present invention.
Figure 2:
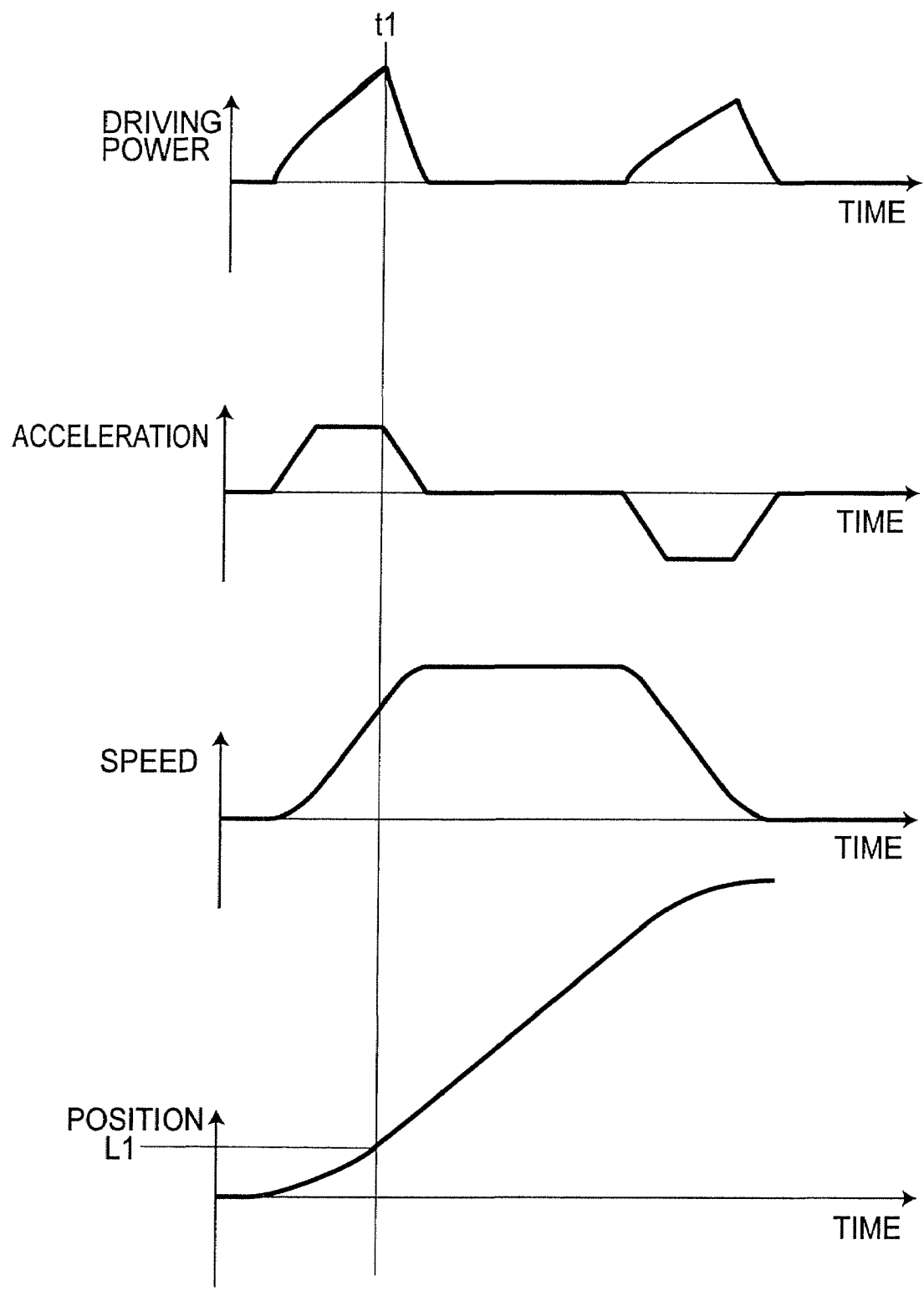
FIG. 2 is a time chart for explaining an example of movable element driving pattern.

In accordance with this embodiment, while referring to FIGS. 1 and 2, in the first step a control unit 23 acquires exposure parameters before start of the exposure operation. The exposure parameters may include the length of the reticle in the scan direction, the scan speed and the acceleration, for example.

In the second step, the control unit 23 determines a driving pattern (profile) of the reticle stage on the basis of the acquired parameters. Subsequently, on the basis of this driving pattern, the control unit calculates the time (t1) in which a largest driving electric power is required. Additionally, on the basis of the time thus calculated, the control unit calculates the position (L1) where a largest driving electric power is required.

In the third step, the position of the stator is set so as to avoid that the position determined at the second step (for example, position pos_max in FIG. 5) is registered with or comes close to the position where the magnetic flux density of at least one phase of coil becomes equal to zero, and then the stator is moved there. The position where the magnetic flux density of at least one phase of coil becomes equal to zero can be stored beforehand as a table. As regards the position toward which the stator is going to be moved, it may be one which does not coincide with or which is not close to the position stored in the table. Preferably, however, the stator position may be set to such position where in both of phases A and B the electric phase angle of the coil becomes equal to 45 degrees, such as the position pos_max in FIG. 6, because in that occasion local heat generation of the coil can be reduced.

In the example described above, if the same driving pattern is going to be repeated, the procedure at the first, second and third steps may be carried out only once at the initial operation.

The example described above has been explained with reference to the driving method of a reticle stage. However, a similar method can be used to a wafer stage as well. In that case, the exposure method may not be a step-and-scan method, but it may be a step-and-repeat method.

Anyway, in accordance with this embodiment of the present invention, an undesirable phenomenon that large heat generation occurs only in one or some of the coils can be avoided, and the largest consumed electric current of each coil can be reduced. As a result, temperature rise of a single coil can be suppressed, and the load to the motor driver can be made light. Thus, good efficiency current consumption is assured.

Other Embodiments

Although the first embodiment described above uses a two-phase exciting sinewave driving method, similar technical advantages are obtainable even with three or more phases. In the case of N-phase exciting sinewave driving method, the optimum position is 90 (deg)/N. Further, as regards the sinewave as an electric current to be applied to the coils, it may include a harmonics component such as sin(3x) or sin(5x), for example.

Furthermore, while the embodiment described above uses a moving magnet type linear motor, the present invention can be applied also to a case where a moving coil type linear motor is used.

Embodiment of Semiconductor Device Manufacture

Next, an embodiment of a device manufacturing method which uses an exposure apparatus described above, will be explained.

Figure 9:
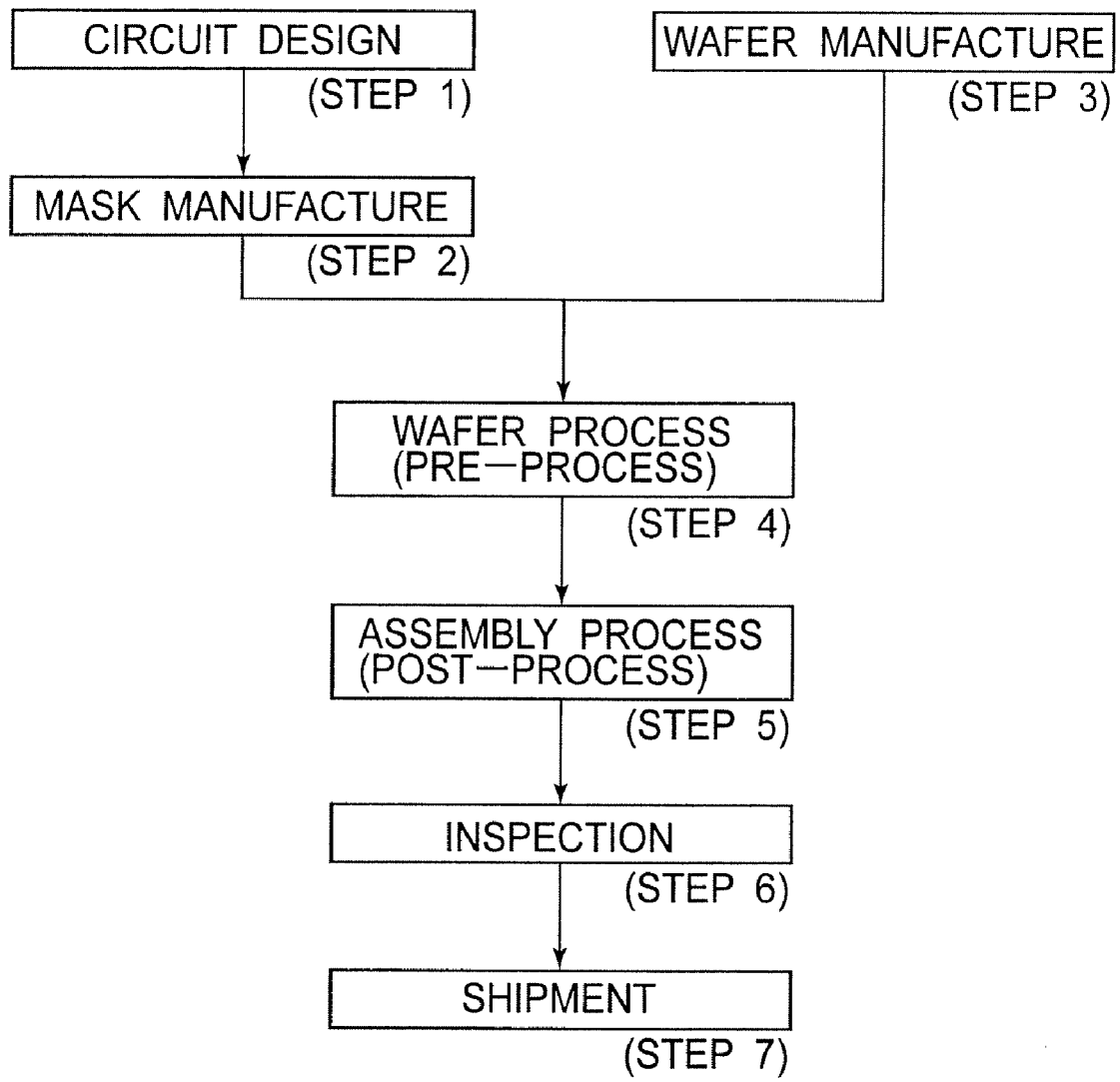
FIG. 9 is a flow chart of a device manufacturing processes.

FIG. 9 is a flow chart for explaining the overall procedure for producing microdevices such as semiconductor devices (e.g., IC or LSI), liquid crystal panels, CCDs, thin film magnetic heads, micromachines, for example.

Step 1 is a design process for designing a circuit of a semiconductor device. Step 2 is a process for making a mask on the basis of the circuit pattern design. Step 3 is a process for preparing a wafer by using a material such as a silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check and so on, for the semiconductor devices produced by step 5, are carried out. With these processes, semiconductor devices are produced, and they are shipped (step 7).

More specifically, the wafer process at step 4 described above includes: (i) an oxidation process for oxidizing the surface of a wafer; (ii) a CVD process for forming an insulating film on the wafer surface; (iii) an electrode forming process for forming electrodes upon the wafer by vapor deposition; (iv) an ion implanting process for implanting ions to the wafer; (v) a resist process for applying a resist (photosensitive material) to the wafer; (vi) an exposure process for printing, by exposure, the circuit pattern of the mask on the wafer through the exposure apparatus described above; (vii) a developing process for developing the exposed wafer; (viii) an etching process for removing portions other than the developed resist image; and (ix) a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-250390 filed Aug. 30, 2004, for which is hereby incorporated by reference.

What is claimed is:

1. A driving device for driving an object using an N-phase excitation sinusoidal wave drive type linear motor, where N≧2, wherein:
   a stator of the linear motor is movable in a direction opposite to or approximately opposite to a driving direction of the object;
   said driving device includes stator moving means configured to position the stator so that an electrical phase angle of the linear motor when the object is accelerated or decelerated is brought into a predetermined state; and
   the predetermined state is such that the electrical phase angle at a moment where a driving electric power of the linear motor becomes largest is equal to or close to 90(deg.)/N.

2. A driving device for driving an object using a phase excitation sinusoidal wave drive type linear motor, wherein:
   a stator of the linear motor is movable in a direction opposite to or approximately opposite to a driving direction of the object;
   said driving device includes stator moving means configured to position the stator so that an electrical phase angle of the linear motor when the object is accelerated or decelerated is brought into a predetermined state; and
   the predetermined state is such that, in each phase, the electrical phase angle at a moment where a driving electric power of the linear motor becomes largest is not equal to or close to zero.

3. A driving device for driving an object using a linear motor, wherein:
   a stator of the linear motor is movable in a direction opposite to or approximately opposite to a driving direction of the object;
   said driving device includes stator moving means configured to position the stator so that an electrical phase angle of the linear motor when the object is accelerated or decelerated is brought into a predetermined state; and
   the predetermined state is such that the electrical phase angle assures uniform or approximately uniform electric currents of coils being driven at a moment where a driving electric power of the linear motor becomes largest.

4. A driving device according to claim 1, wherein the linear motor is a multi-phase excitation sinusoidal wave drive type linear motor.

5. An exposure apparatus including a driving device recited in claim 1 as a driving device for an original stage and/or a substrate stage.

6. A device manufacturing method, comprising:
   a step of exposing a substrate using an exposure apparatus as recited in claim 5; and
   a step of developing the exposed substrate.

* * * * *